THERMOELECTRIC GENERATOR UNIT

Filed Sept. 14, 1959

INVENTORS.
GUNNAR A.F. WINCKLER
RICHARD C. EVANS
R. S. Strickler 3,048,643

THERMOELECTRIC GENERATOR UNIT

Gunnar A. F. Winckler, Milford, and Richard C. Evans, Hamden, Conn., assignors, by mesne assignments, to United Nuclear Corporation, New Haven, Conn., a corporation of Delaware Filed Sept. 14, 1959, Ser. No. 839,911
3 Claims. (Cl. 136—4)

This invention relates to the production of electrical power through utilization of the Seebeck effect in a thermocouple.

In particular, the invention is directed to thermocouple structure in the region of the junction of the dissimilar metals comprising the thermocouple.

It is well known that a thermocouple may be used as a thermoelectric generator to produce an electrical current. This is accomplished by devising a closed circuit made of two different metals in which one junction between the metals is held at a higher temperature than the other junction. As long as the temperature differential is maintained between the two junctions an electrical current will flow in the circuit. This phenomenon is known as the Seebeck effect.

Correspondingly, it is well known that the inverse of the Seebeck effect is true in that if one directs current through a junction of two dissimilar metals, heat is absorbed by the junction when the current flows in one direction and is emitted from the junction when the current is reversed. This inverse effect is known as the Peltier effect.

In thermoelectric devices, such as thermocouples, utilized to generate electrical current, the scientist has been faced perennially with the desire to increase the efficiency of the generator.

The efficiency of the generator involves the maintenance of a low thermal conductivity at the hot junction while maintaining a high electrical conductivity. Unfortunately, structural arrangements which develop a desirable thermal barrier are poor conductors of electricity and vice versa.

Accordingly, it is a prime purpose of the present invention to disclose a thermoelectric generator structure having a novel arrangement in the region of the hot junction thereof.

It is a further object of the present invention to provide a highly efficient thermoelectric generator unit.

It is a further object of the invention to provide a mechanical means for controlling thermal conductivity.

A further object of the invention is to provide a novel structure for a thermoelectric element where said element incorporates compositely a mixture of a dielectric material and a thermoelectric element.

Although thermoelectric elements forming a thermoelectric unit (or a thermocouple) may be described in the succeeding specification and appended claims as comprising antimony, bismuth, lead telluride or other well-known thermoelectric materials, it is to be understood that such description is not made by way of limitation but is utilized merely for the purpose of aiding in the explanation of the novel structure embracing the present invention.

The only limitation is that each thermoelectric unit or thermocouple disclosed be composed of at least two dissimilar thermoelectric elements where one element is composed of a thermoelectric material such as antimony, which in the semi-conductor art is referred to as a P-type material; i.e., a material having an excess of electron vacancies in its atomic structure, while the other thermoelectric element is composed of a dissimilar thermoelectric material, such as bismuth, known in the art as an N-type material; i.e., a material having an excess of electrons in its atomic structure.

As stated previously, an ideal thermoelectric unit is one in which there is low thermal conductivity, sometimes referred to as a good thermal barrier, in the region of the junction of the P and N elements while retaining a high electrical conductivity at the junction thereby facilitating the withdrawal of maximum electrical current losing a minimum of power in heat of resistivity.

Stated otherwise, an ideal thermoelectric unit is one that sets up a thermal barrier in the junction of the dissimilar thermoelectric elements while not affecting electrical conductivity.

A thermoelectric unit embracing the principles of the present invention including a P-type thermoelectric element and an N-type thermoelectric element forming a junction with one another and having a thermal barrier in the region of said junction may comprise a first thermoelectric element, a cooling means spaced from said element, a second dissimilar thermoelectric element disposed between the first element and the cooling means and in physical contact with said first element and said cooling means, said second element comprising a mixture of dielectric material and said second element in finely divided form.

Another thermoelectric unit defining an alternative embodiment of the invention may comprise a first thermoelectric element, a cooling means spaced from said first element, a second dissimilar thermoelectric element disposed between the first element and the cooling means, said second element being in physical contact with said first element and with said cooling means, said second element being formed in at least two main sections connected by at least one neck portion.

Other features and advantages of the present invention will become more apparent from the succeeding specification when read in conjunction with the appended drawings, in which.

Figures 3, 4:
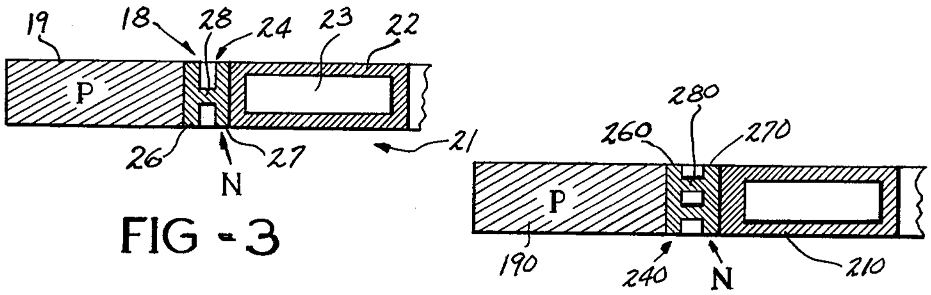
Figure 7:
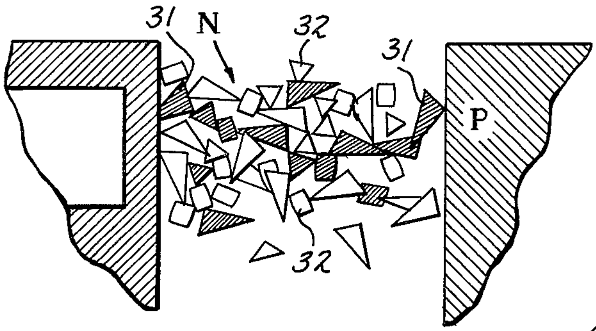
Figure 5:
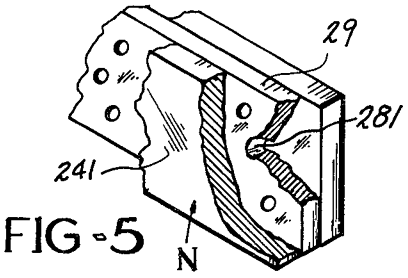
Figure 6:
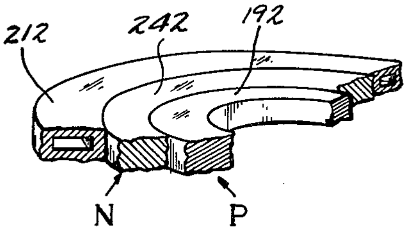

FIG. 3 discloses a sectional view of a junction of a thermoelectrical unit embracing the principles of the present invention;

FIG. 4 is similar to the illustration of FIG. 3 showing an alternative embodiment of the junction structure;

FIG. 5 shows a further embodiment of the junction structure;

FIG. 6 illustrates a still further embodiment of the invention, and;

FIG. 7 discloses a portion of the illustration of FIG. 6, somewhat enlarged, to show the composition of the N element.

Before proceeding with the description of the disclosed embodiments of the present invention, it is well to point out that although the specification and the drawings may disclose a thermoelectric unit having a P-type element disposed on one side of the junction and an N-type element disposed on the other side thereof, it is entirely within the spirit and scope of the invention that these elements be interposed with the result being that the direction of current flow is reversed.

Figure 1:
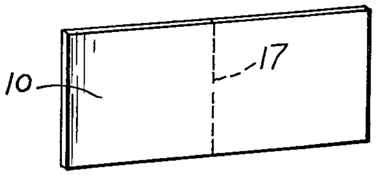
FIG. 1 is a perspective view of a metallic thermal and electrical conductor.
Figure 2:
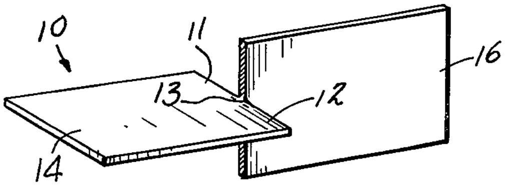
FIG. 2 is a perspective view of the conductor of FIG. 1 illustrating the strip after having been partially sheared into two sections, one section having been rotated relative to the other.

FIGS. 1 and 2 are shown for the purpose of explaining the theory upon which the thermal barrier of the present invention is based. The metallic conductor of FIG. 1, indicated by the reference numeral 10, may be considered for purposes of the present specification as a brass strip having a given electrical resistance per unit length and having a corresponding thermal conductivity.

The disclosure of FIG. 2 shows the same brass strip after having been sheared along the lines 11 and 12 leaving a neck or bridge portion 13 connecting sections 14 and 16. In order to show clearly that the brass strip has only been partially severed and to interrupt thermal conductivity, the sections 14 and 16 having been rotated relative to one another through an angle of 90° to the position shown in FIG. 2.

The significant point to note with respect to conformation of the metal strip in FIG. 2 as against its conformation in FIG. 1 is that its total electrical resistance is not greatly affected by the marked degree to which the metal strip has been severed while the thermal conductivity of the sheet has been greatly changed.

The electrical resistance between sections 14 and 16 of the brass strip in the region of the neck 13 is virtually unchanged over the resistance which existed at the corresponding cross section in FIG. 1 evidenced by the dotted line 17. Since total resistance of a given conductor is equal to resistance per unit length multiplied by length, the total resistance of the neck 13, although of reduced cross section, is not appreciably different from the resistance across the cross section referenced 17 because the length of the sheet 13 approaches zero.

In contrast, thermal conductivity of the arrangement of FIG. 2 as against the arrangement of FIG. 1 is greatly changed because the only area available for the transfer of heat from section 14 to section 16 resides in the narrow, short neck 13. There will be virtually no heat conductivity from the edge portions 11 and 12 because they are no longer in contact with their mating edges.

Projecting the structure disclosed in FIGS. 1 and 2 into thermocouple design, FIG. 3 discloses a hot junction indicated generally by the reference numeral 18 comprising a P element 19 and a cooling means indicated generally by the reference numeral 21 defining a brass tube 22 through which cooling fluid 23 is circulated.

Disposed between the P element and the cooling means is an N element indicated generally by the reference numeral 24 and defining a first section 26 and a second section 27 connected by a neck portion 28. The P element is maintained hot by any suitable means so as to establish a hot junction 18 at the inner faces of the P element (section 26) and the N element. The thermal barrier is established by the neck portion 28.

The necking, as at the neck portion 28, is operative to increase temperature change per unit length, radically. Thus, it is desirable to fabricate the thermoelectric element embracing the neck from a thermoelectric material which produces the greatest number of microvolts per degree of temperature differential. For example, it would be more desirable to fabricate the necked thermoelectric element from tellurium which produces approximately 100 microvolts per degree temperature differential as against iron whose output is of the order of 30 microvolts per degree.

FIG. 4 shows an alternative embodiment of the arrangement of FIG. 3 wherein a P element 190 is spaced from a cooling means 210 while the N element 240 is formed with two neck portions 280—280 connecting sections 260 and 270 thereof.

In this embodiment of the invention the hot junction is defined by the interface of section 260 and the corresponding face of P element 190.

FIG. 5 shows a still further embodiment of a heat barrier structure wherein a plurality of neck portions 281 of thermoelectric material are devised by utilizing a perforated dielectric material 29 such as a perforated sheet of mica with powdered thermoelectric material 241 surrounding the mica. The bridges 281 are established by forcing powdered thermoelectric material into the perforations in the mica sheet.

A still further embodiment of the invention is disclosed in FIGS. 6 and 7 wherein an N-type material 242 is shown disposed between P material 192 and cooling tube 212. In this form of the invention the bridge or neck structure comprising the thermal barrier is devised by mixing finely divided thermoelectric material indicated by the reference numeral 31 (FIG. 7) with finely divided dielectric material referenced 32.

In a heterogenous mixture of finely divided thermoelectric and dielectric materials, haphazard chains or bridges of thermoelectric material are established spanning the gap between the thermoelectric element and the cooling means to establish a heat barrier without hindering electrical conductivity.

It is anticipated that a wide variety of variations may be devised in the basic thermal barrier structure disclosed without departing from the spirit and scope of the present invention.

What is claimed is:

1. A thermoelectric generator unit consisting of a first thermoelectric element, a cooling means spaced from said first element, a second thermoelectric element disposed in the space between the first element and the cooling means, said second element being in physical contact with said first element and with said cooling means and said second element being formed in at least two main sections connected by at least one neck portion.

2. The thermoelectric generator unit of claim 1 wherein the second thermoelectric element is formed in two main sections with a perforated, dielectric separator disposed between said sections, said sections of the second element being connected to one another through said perforations.

3. A method of fabricating a thermoelectric element comprising the steps of providing finely divided thermoelectric material, providing a perforated sheet of dielectric material, surrounding the perforated sheet of dielectric material with finely divided thermoelectric material and pressing the finely divided thermoelectric material into the perforations to form a plurality of bridges between the finely divided thermoelectric material on opposite sides of the dielectric material.

References Cited in the file of this patent

UNITED STATES PATENTS

| | | |
|---|---|---|
| 652,437 | Matthias | June 26, 1900 |
| 1,848,655 | Petrik | Mar. 18, 1932 |
| 2,215,332 | Milnes | Sept. 17, 1940 |
| 2,232,961 | Milnes | Feb. 25, 1941 |
| 2,502,399 | Greeff | Mar. 28, 1950 |
| 2,597,752 | Salisbury | May 20, 1952 |
| 2,844,638 | Lindenblad | July 22, 1958 |

FOREIGN PATENTS

| | | |
|---|---|---|
| 8,985 | Great Britain | May 1, 1901 |
| 742,364 | France | Dec. 27, 1932 |
| 1,026,339 | Germany | Mar. 20, 1958 |